US009142284B2

(12) United States Patent
Lee et al.

(10) Patent No.: US 9,142,284 B2

(45) Date of Patent: Sep. 22, 2015

(54) CONCURRENT USE OF SRAM CELLS WITH BOTH NMOS AND PMOS PASS GATES IN A MEMORY SYSTEM

(71) Applicant: Marvell World Trade Ltd., St. Michael (BB)

(72) Inventors: Winston Lee, Palo Alto, CA (US); Peter Lee, Pleasanton, CA (US)

(73) Assignee: MARVELL WORLD TRADE LTD., St. Michael (BB)

( * ) Notice: Subject to any disclaimer, the term of this patent is extended or adjusted under 35 U.S.C. 154(b) by 0 days.

(21) Appl. No.: 14/066,796

(22) Filed: Oct. 30, 2013

(65) Prior Publication Data

US 2014/0133217 A1 May 15, 2014

Related U.S. Application Data

(60) Provisional application No. 61/725,163, filed on Nov. 12, 2012.

(51) Int. Cl.

| | |
|---|---|
| ***G11C 7/00*** | (2006.01) |
| ***G11C 11/412*** | (2006.01) |
| ***G11C 7/12*** | (2006.01) |
| ***G11C 8/08*** | (2006.01) |
| ***G11C 11/417*** | (2006.01) |
| ***G11C 11/419*** | (2006.01) |

(52) U.S. Cl.

CPC ................ *G11C 11/412* (2013.01); *G11C 7/12* (2013.01); *G11C 8/08* (2013.01); *G11C 11/417* (2013.01); *G11C 11/419* (2013.01)

(58) Field of Classification Search

CPC ................................ G11C 11/412; G11C 7/12

USPC ................................................. 365/154, 203

See application file for complete search history.

(56) References Cited

U.S. PATENT DOCUMENTS

| | | | | |
|---|---|---|---|---|
| 5,392,235 | A | 2/1995 | Nishitani et al. | |
| 5,706,226 | A | 1/1998 | Chan et al. | |
| 6,671,197 | B2 | 12/2003 | Athanassiadis | |
| 7,382,672 | B2 * | 6/2008 | Barth et al. | 365/208 |
| 7,423,911 | B2 * | 9/2008 | Kang | 365/185.23 |
| 7,436,708 | B2 * | 10/2008 | Roohparvar | 365/185.18 |
| 7,495,944 | B2 | 2/2009 | Parkinson et al. | |
| 7,499,349 | B2 | 3/2009 | Roehr | |

(Continued)

FOREIGN PATENT DOCUMENTS

| | | | |
|---|---|---|---|
| EP | 0011448 | A1 | 5/1980 |
| EP | 1426975 | A2 | 6/2004 |

(Continued)

OTHER PUBLICATIONS

International Search Report for PCT/US2013/064819 dated Feb. 11, 2014; 7 Pages.

(Continued)

*Primary Examiner* — Michael Tran

(57) ABSTRACT

A memory system includes first memory cells and second memory cells. Each of the first memory cells includes first and second pass gates including NMOS transistors. Each of the second memory cells include first and second pass gates including PMOS transistors. The first memory cells are pre-charged by one polarity of a voltage supply. The second memory cells are pre-charged by an opposite polarity of the voltage supply.

20 Claims, 15 Drawing Sheets

(56) References Cited

U.S. PATENT DOCUMENTS

| | | | | |
|---|---|---|---|---|
| 7,570,524 | B2 | 8/2009 | Bedeschi et al. | |
| 7,835,171 | B2 | 11/2010 | Ono et al. | |
| 7,903,448 | B2 | 3/2011 | Oh et al. | |
| 8,059,448 | B2 | 11/2011 | Tanigami et al. | |
| 8,064,241 | B2 | 11/2011 | Morita et al. | |
| 8,760,927 | B2 | 6/2014 | Deng | |
| 8,817,528 | B2 | 8/2014 | Otto et al. | |
| 8,885,388 | B2 | 11/2014 | Sutardja et al. | |
| 2004/0252548 | A1 | 12/2004 | Tsukamoto et al. | |
| 2008/0310221 | A1 | 12/2008 | Baker | |
| 2009/0243652 | A1* | 10/2009 | Dorairaj et al. | 326/38 |
| 2009/0303785 | A1 | 12/2009 | Hwang et al. | |
| 2010/0097844 | A1 | 4/2010 | Liu | |
| 2010/0110762 | A1 | 5/2010 | Chen et al. | |
| 2010/0142245 | A1 | 6/2010 | Kitagawa | |
| 2010/0157706 | A1* | 6/2010 | Cho et al. | 365/203 |
| 2010/0259968 | A1 | 10/2010 | Tsushima et al. | |
| 2010/0296334 | A1* | 11/2010 | Houston et al. | 365/156 |
| 2010/0296336 | A1* | 11/2010 | Houston | 365/156 |
| 2011/0007553 | A1 | 1/2011 | Takagi et al. | |
| 2011/0051499 | A1 | 3/2011 | Hamilton | |
| 2011/0228599 | A1 | 9/2011 | Tian et al. | |
| 2012/0014171 | A1 | 1/2012 | Chuang et al. | |
| 2012/0063196 | A1 | 3/2012 | Kim et al. | |
| 2012/0087175 | A1 | 4/2012 | Zhu et al. | |
| 2012/0140552 | A1 | 6/2012 | Seikh et al. | |
| 2012/0155151 | A1 | 6/2012 | Rachamadugu et al. | |
| 2014/0003126 | A1 | 1/2014 | Huang | |
| 2014/0104926 | A1 | 4/2014 | Sutardja et al. | |
| 2014/0104927 | A1 | 4/2014 | Sutardja et al. | |
| 2014/0112057 | A1 | 4/2014 | Sutardja et al. | |
| 2014/0119103 | A1 | 5/2014 | Lee et al. | |
| 2014/0133217 | A1 | 5/2014 | Lee et al. | |

FOREIGN PATENT DOCUMENTS

| | | | |
|---|---|---|---|
| EP | 2063467 | A1 | 5/2009 |
| WO | WO-2007138646 | A1 | 12/2007 |
| WO | WO-2009013819 | A1 | 1/2009 |

OTHER PUBLICATIONS

International Search Report for PCT Application No. 2013/064811 mailed Dec. 6, 2014; 3 Pages.

International Search Report for PCT Application No. PCT/US2013/066303; May 16, 2014; 6 pages.

International Search Report for PCT Application No. PCT/US2013/067441; Jan. 23, 2014; 7 pages.

Notification of Transmittal of The International Search Report and The Written Opinion of The International Searching Authority, or The Declaration dated Feb. 3, 2014 in reference to PCT/US2013/067454 (13 pgs).

Xu Wang et al: "A nove 1 1 ow power 64-kb SRAM using bit-lines charge-recycling and non-uniform cell scheme", Electronics, Circuits and Systems (ICECS), 2011 18th IEEE International Conference on, IEEE, Dec. 11, 2011, pp. 528-531.

Synopsys Insight Newsletter; FinFET: The Promises and the Challenges; Issue 3, 2012; 5 pages.

U.S. Appl. No. 14/050,678, Pantas Sutardja et al.

U.S. Appl. No. 14/050,696, Pantas Sutardja et al.

U.S. Appl. No. 14/059,790, Pantas Sutardja et al.

U.S. Appl. No. 14/066,817, Peter Lee et al.

* cited by examiner

CONCURRENT USE OF SRAM CELLS WITH BOTH NMOS AND PMOS PASS GATES IN A MEMORY SYSTEM

CROSS-REFERENCE TO RELATED APPLICATIONS

This application claims the benefit of U.S. Provisional Application No. 61/725,163, filed on Nov. 12, 2012. The entire disclosure of the application referenced above is incorporated herein by reference.

This application is related to U.S. application Ser. No. 14/066,817, filed Oct. 30, 2013, entitled, “SRAM Cells Suitable for Fin Field-Effect Transistor (Fin FET) Process”. The entire disclosure of the application referenced above is incorporated herein by reference.

FIELD

The present disclosure relates to memory systems, and more particularly to memory systems including static random access memory (SRAM) cells using both PMOS and NMOS pass gates.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Referring now to FIG. 1, a static random access memory (SRAM) cell 10 is shown to include NMOS transistors 14 and 18 arranged as pass gates. Transistor pairs 22 and 24 each include a PMOS transistor having a first terminal connected to $V_{DD}$ and an NMOS transistor having a second terminal connected to $V_{SS}$. The transistors 14 and 18 include gates connected to a wordline (WL) 40 and first and second terminals connected between the transistor pairs 22 and 24 and bitlines BL 42 and BLB 44, respectively.

If the wordline is not asserted, the transistors 14 and 18 disconnect the SRAM cell 10 from the bitlines BL 42 and BLB 44.

A read cycle is started by pre-charging the bitlines BL 42 and BLB 44 and then asserting the wordline WL 40, which enables both of the transistors 14 and 18. Then the values stored by the transistor pairs 22 and 24 are transferred to the bitlines by leaving either BL or BLB at its pre-charged value and discharging either BLB or BL. A sense amplifier (not shown) senses whether BL or BLB has a higher voltage to determine whether a 1 or 0 is stored.

During a write cycle, a value to be written is applied to the bitlines BL 42 and BLB 44. When writing a 0, a 0 is applied to the bitlines by setting either BL or BLB to 1 and either BLB or BL to 0. This is similar to applying a reset pulse to an SR-latch, which causes the flip flop to change state. A 1 is written by inverting the values of the bitlines BL 42 and BLB 44. The wordline 40 is then asserted and the value that is to be stored is latched.

SRAM designs use NMOS transistors for the pass gates because the NMOS transistors have higher drive strength ($I_{dsat}$) than the PMOS transistors for a given size. The higher drive strength provides higher read performance, lower area and reduced power consumption for the SRAM cells as compared to SRAM cells using PMOS pass gates.

FIG. 2 shows an example of a wordline segment 100 that includes SRAM cells 102-1, 102-2, . . . 102-T (collectively SRAM cells 102) that are connected together, where T is an integer greater than one. The wordline segment 100 also includes a buffer 106 including two inverters 108 and 110. Each of the SRAM cells 102 uses NMOS transistors as pass gates as described above.

FIG. 3 shows a memory row 118 including wordline segments 100-1, 100-2, . . . 100-R (collectively wordline segments 100) that are connected together, where R is an integer greater than one. A wordline decoder/driver 120 generates control signals to drive the wordline segments 100. In the example in FIG. 3, R=4 and there are a total of 2×4=8 inverters associated with the memory row 118.

SUMMARY

A memory system includes first memory cells and second memory cells. Each of the first memory cells includes first and second pass gates including NMOS transistors. Each of the second memory cells include first and second pass gates including PMOS transistors. The first memory cells are pre-charged by one polarity of a voltage supply. The second memory cells are pre-charged by an opposite polarity of the voltage supply.

In other features, a first pre-charge circuit is connected to the one polarity of a voltage supply and to the first memory cells. A second pre-charge circuit is connected to the opposite polarity of the voltage supply and to the second memory cells.

In other features, the memory includes first wordline segments and second wordline segments. Each of the first wordline segments includes a plurality of the first memory cells. Each of the second wordline segments includes a plurality of the second memory cells. Ones of the first wordline segments are arranged between ones of the second wordline segments.

In other features, the first memory cells and the second memory cells comprise static random access memory (SRAM) cells.

In other features, each of the first wordline segments comprises a buffer including a single inverter and each of the second wordline segments comprises a buffer including a single inverter.

In other features, first bitlines of the first memory cells in the first wordline segments are selectively pre-charged by the one polarity of the voltage supply. Second bitlines of the second memory cells in the second wordline segments are selectively pre-charged by the opposite polarity of the voltage supply.

A memory array includes a first array including a plurality of first wordline segments. Each of the plurality of first wordline segments includes a plurality of first memory cells. Each of the plurality of first memory cells comprises first and second pass gates including NMOS transistors. A second array includes a plurality of second wordline segments. Each of the plurality of second wordline segments includes a plurality of second memory cells. Each of the plurality of second memory cells comprises first and second pass gates including PMOS transistors. A wordline decoder/driver is connected to first wordlines of the plurality of first wordline segments and second wordlines of the plurality of first wordline segments.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

While the foregoing description relates to SRAM cells, the present disclosure applies to any memory elements. Additional examples include but are not limited to resistive random access memory (RRAM), dynamic random access memory (DRAM) and other memory elements.

SRAM cells typically use NMOS transistors for the pass gates because NMOS transistors usually have a much higher drive strength ($I_{dsat}$) than PMOS transistors for a given size for processes with features sized greater than or equal to 20 nm. The higher drive strength translates to higher read performance, lower area and reduced power consumption for the SRAM cells as compared to SRAM cells using PMOS pass gates. However, as the feature sizes become smaller (e.g. less than 20 nm), the ratio of NMOS to PMOS $I_{dsat}$ is close to 1. Therefore, SRAM cells can use PMOS transistors for the pass gates.

Figure 4A:
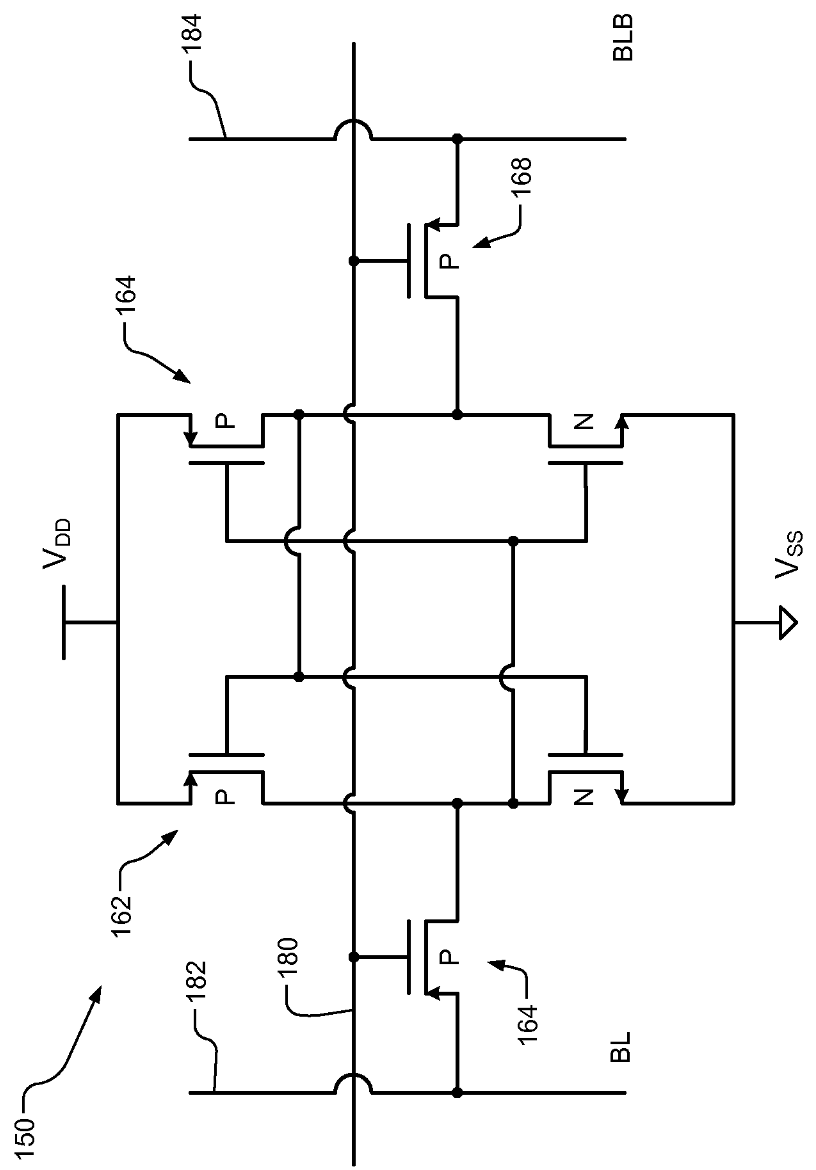
FIG. 4A is an electrical schematic of an example of an SRAM cell using PMOS transistors as pass gates.

Referring now to FIG. 4A, an SRAM cell 150 is shown to include PMOS transistors 154 and 158 operating as pass gates. Transistor pairs 162 and 164 include PMOS transistors connected to $V_{DD}$ and NMOS transistors connected to $V_{SS}$. The transistors 164 and 168 have gates connected to a wordline (WL) 180 and first and second terminals connected between the transistor pairs 162 and 164, respectively, and bitlines BL 182 and BLB 184.

The present disclosure relates to memory systems including both NMOS SRAM cells (NScells) and PMOS SRAM (PScells) within the same memory system. The present disclosure also describes memory systems including PScells and NScells. The advantages of using mixed memory cells include reduced area, increased performance, and reduced transient power noise. For example only, the memory may include memory segments, arrays, ICs or SOCs using both PScells and NScells connected to the same power supply and ground reference.

As feature sizes become smaller, metal sheet resistance increases. This has a very significant effect on wordline resistance and the number of cells that can be placed along a wordline. Some designs use global wordlines with local buffers to avoid RC time constant problems. This approach is expensive due to an extra layer of metal that is required for the global wordline.

Figure 1:
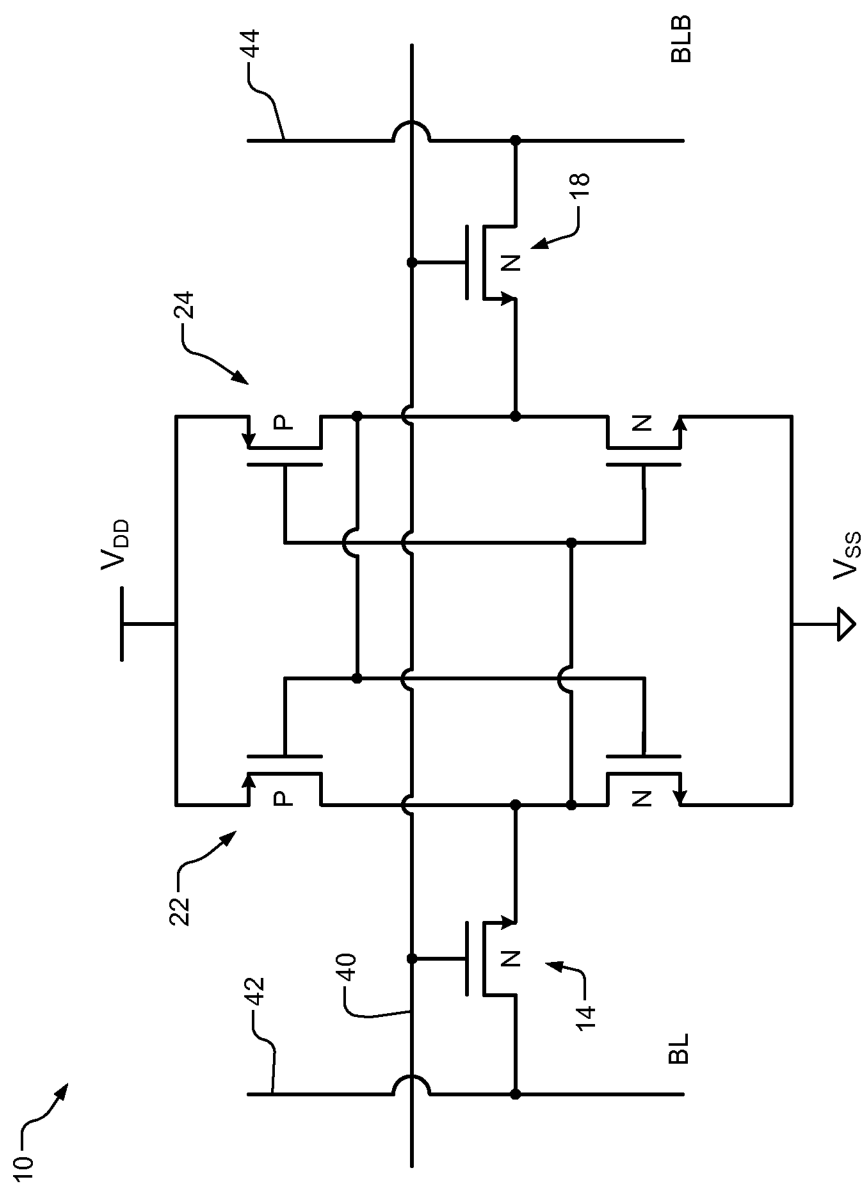
FIG. 1 is an electrical schematic of an example of an SRAM cell using NMOS transistors as pass gates according to the prior art.
Figures 2, 3:
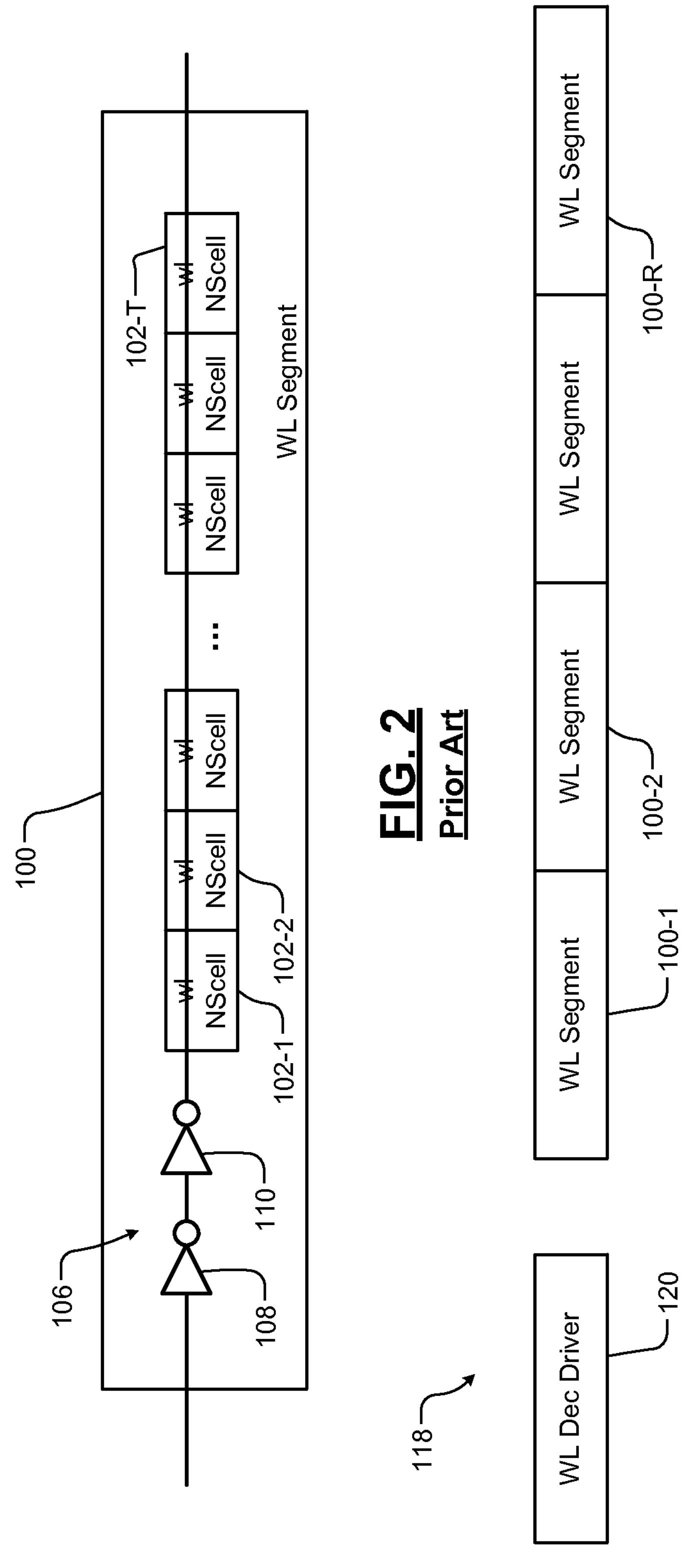
FIG. 2 is an electrical schematic and functional block diagram of a wordline segment including multiple inverters and multiple SRAM cells using NMOS transistors as pass gates according to the prior art.
FIG. 3 is an electrical schematic and functional block diagram of memory including multiple wordline segments with NMOS transistors as pass gates and a wordline decoder/driver according to the prior art.

Another method divides the wordline into segments and places buffers between the segments to drive a next segment. Typically, the buffers include two series connected inverters as shown in FIG. 2. One disadvantage of this approach is delay caused by the two inverters and cost associated with the area required for the inverters. With two inverter delays per segment, a high performance design typically cannot tolerate more than a few segments after which more memory cells are placed in a new array. As the number of arrays that are needed increases, the area that is needed also increases.

Figure 4B:
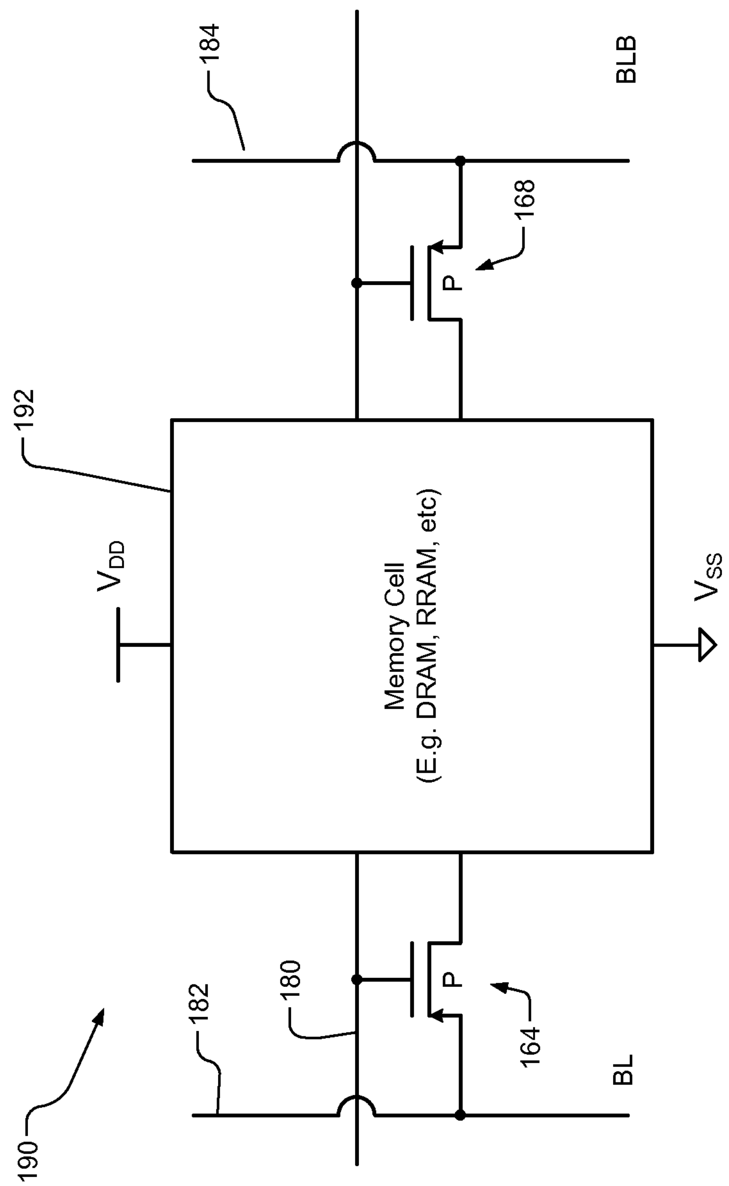
FIG. 4B is an electrical schematic of an example of a memory cell such as DRAM, RRAM, etc. using PMOS transistors as pass gates.

FIG. 4B shows an arrangement for memory 190 that is similar to FIG. 4A except that the transistor pairs of the SRAM memory cell are replaced by another memory cell 190. In some examples, the memory cell 192 comprises a dynamic random access memory (DRAM) cell, a resistive random access memory (RRAM) cell, or other memory cell. As can be appreciated, the number of select gates for each memory element can be varied. For example only, DRAM and RRAM cells typically require only one select gate, but a dual-port sram memory cell may require four select gates.

Figure 5:
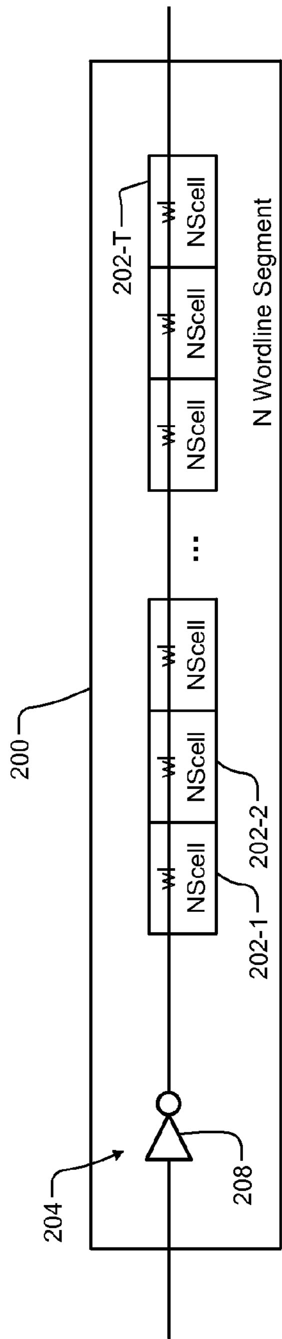
FIG. 5 is an electrical schematic and functional block diagram of a wordline segment including a single inverter and multiple SRAM cells using NMOS transistors as pass gates according to the present disclosure.

FIG. 5 shows an example of a wordline segment 200 using NMOS transistors as pass gates (hereinafter N wordline segment 200) that includes NScells 202-1, 202-2, . . . , and 202-T. T is an integer greater than one. A buffer 204 includes only a single inverter 208 that is connected to a wordline coupled to pass gates of the NScells 202-1, 202-2, . . . , and 202-T. The N wordline segments 200 include NScells with pass gates coupled to outputs of inverter 208.

Figure 6:
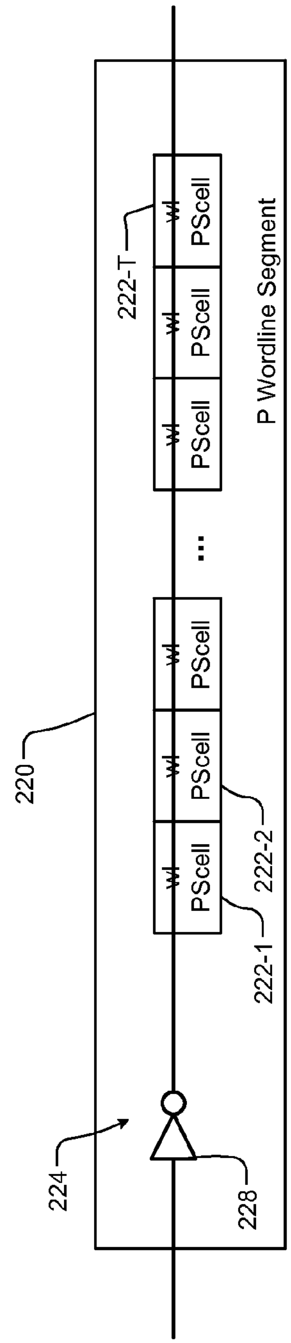
FIG. 6 is an electrical schematic and functional block diagram of a wordline segment including a single inverter and multiple SRAM cells using PMOS transistors as pass gates according to the present disclosure.

FIG. 6 shows an example of a wordline segment 220 using PMOS transistors as pass gates (hereinafter P wordline segment 220) that includes PScells 222-1, 222-2, . . . , and 222-T. T is an integer greater than one. A buffer 224 includes only a single inverter 228 that is connected to a wordline coupled to pass gates of the PScells 222-1, 222-2, . . . , and 222-T. The P wordline segments 220 include PScells with pass gates coupled to outputs of the inverter 228.

Figure 7:
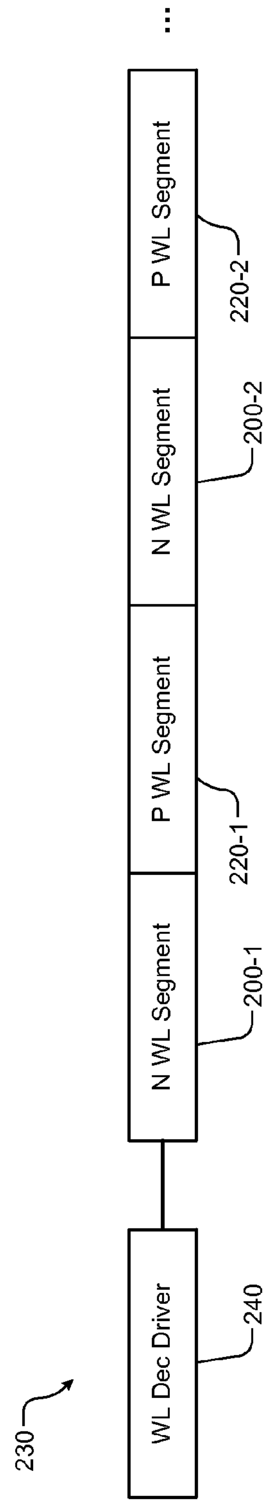
FIG. 7 is an electrical schematic and functional block diagram of multiple wordline segments with both NMOS and PMOS transistors as pass gates and a wordline decoder/driver according to the present disclosure.

FIG. 7 shows memory 230 including alternating N wordline segments 200 (200-1, 200-2, . . . ) and P wordline segments 220 (220-1, 220-2, . . . ). A wordline decoder/driver 240 generates wordline signals for the N wordline segments 200 and P wordline segments 220.

FIGS. 5-7 illustrate the use of NScells in one wordline segment and the use of PScells in another wordline segment to reduce a delay between wordline segments to 1 inverter delay. The inverter is used to invert the polarity of the signal required to access the NScells and PScells. Since only one inverter is required between wordline segments, layout area is reduced. Additionally, for a given allowable amount of buffer delay per wordline, twice the number of cells can be coupled to a wordline. Conversely, if area is to remain constant relative to conventional approaches, the memory system according to the present disclosure can provide a shorter total delay because additional and shorter segments can be used to reduce the RC constant of each wordline segment.

Figure 8:
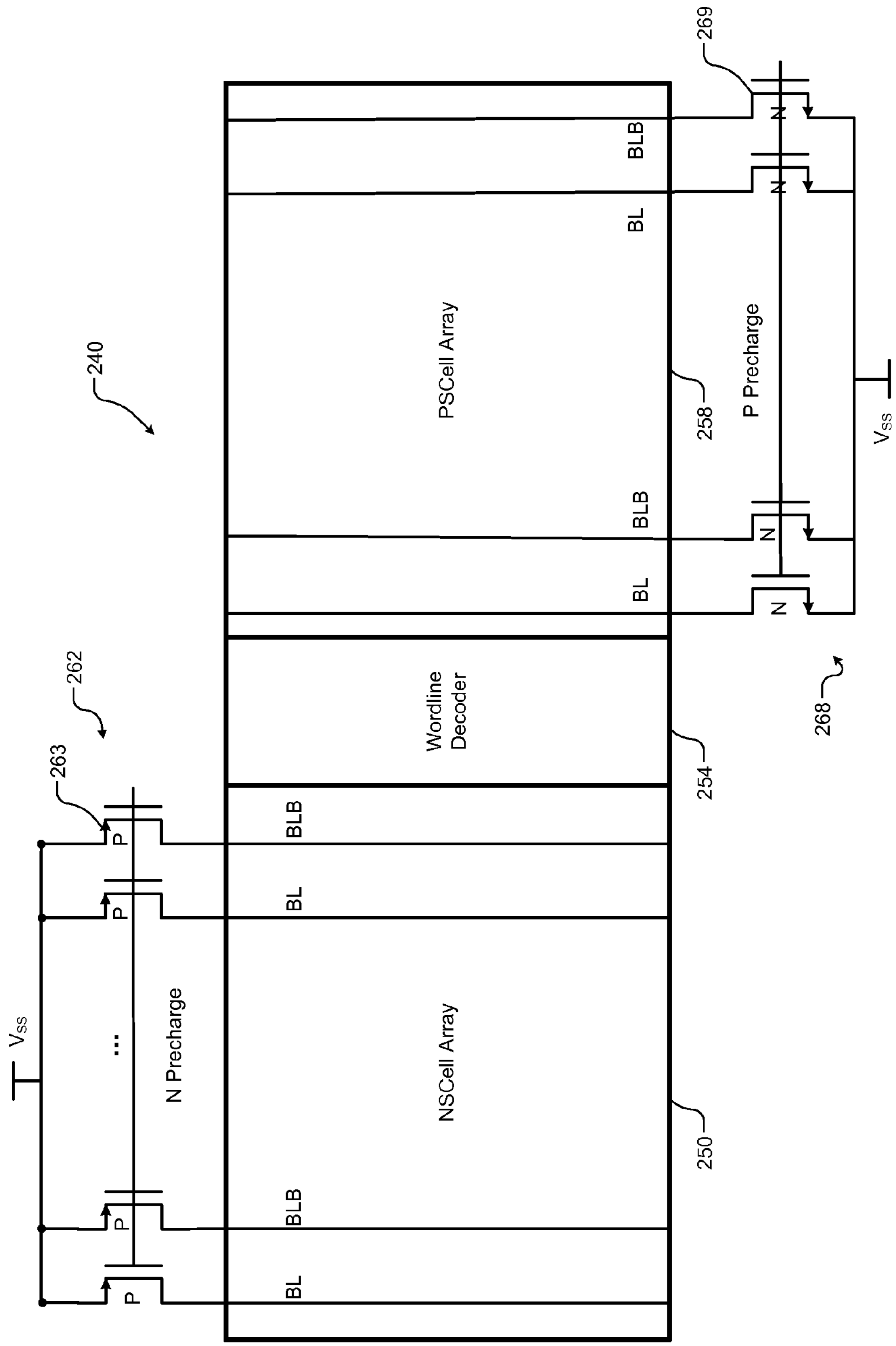
FIGS. 8-11B are electrical schematics and functional block diagrams of memory systems including various combinations of NMOS SRAM cell sections, PMOS SRAM cell sections, PMOS SRAM cell arrays and/or NMOS SRAM cell arrays.

FIG. 8 shows a memory 240 including an NScell array 250, a wordline decoder driver 254, and a PScell array 258. A pre-charge circuit 262 for the NScell array 250 includes PMOS transistors 263 having second terminals connected to bitlines BL and BLB in the NScell array 250. First terminals of the transistors 263 are connected to $V_{DD}$. Control terminals of the transistors 263 of the pre-charge circuit 262 are connected together.

A pre-charge circuit 268 for the PScell array 258 includes NMOS transistors 269 including first terminals connected to bitlines BL and BLB. Second terminals of the NMOS transistors 269 are connected to $V_{SS}$. Control terminals of the NMOS transistors 269 are connected together.

With traditional NScell arrays, there is significant transient current drawn from the $V_{DD}$ supply to pre-charge all of the array bitlines high after a read or write operation. The transient current can cause transient voltage spikes on the system power supply lines when many memories are simultaneously operated. The use of NScells and PScells in a design can reduce the transients because NScell bitlines are pre-charged high while the PScell bitlines (the remainder of the bitlines) are pre-charged low, resulting in a fraction of the current supplied by $V_{DD}$ as compared to conventional designs.

The total charge transfer required for pre-charging all bitlines remain the same. However, some of the charge transfer is handled by $V_{SS}$. For example, if half of the number of columns of NScells are converted to PScells columns, the amount of charge from $V_{DD}$ for pre-charge operation is halved, and the other have is transferred to $V_{SS}$. Essentially the use of NScells and PScells allows the required bitline pre-charge current to be supplied by two power grids instead of one.

Typically the $V_{DD}$ and $V_{SS}$ power grid resistance and inductance are not equal within a memory design or with a system incorporating the memories. The memory designer can strategically ratio the use of NScells and PScells within the design to minimize power rail transients. Moreover, in systems incorporating many memory macros, the system designer can strategically ratio the use of memory macros comprising NScells, PScells or both.

Figure 9A:
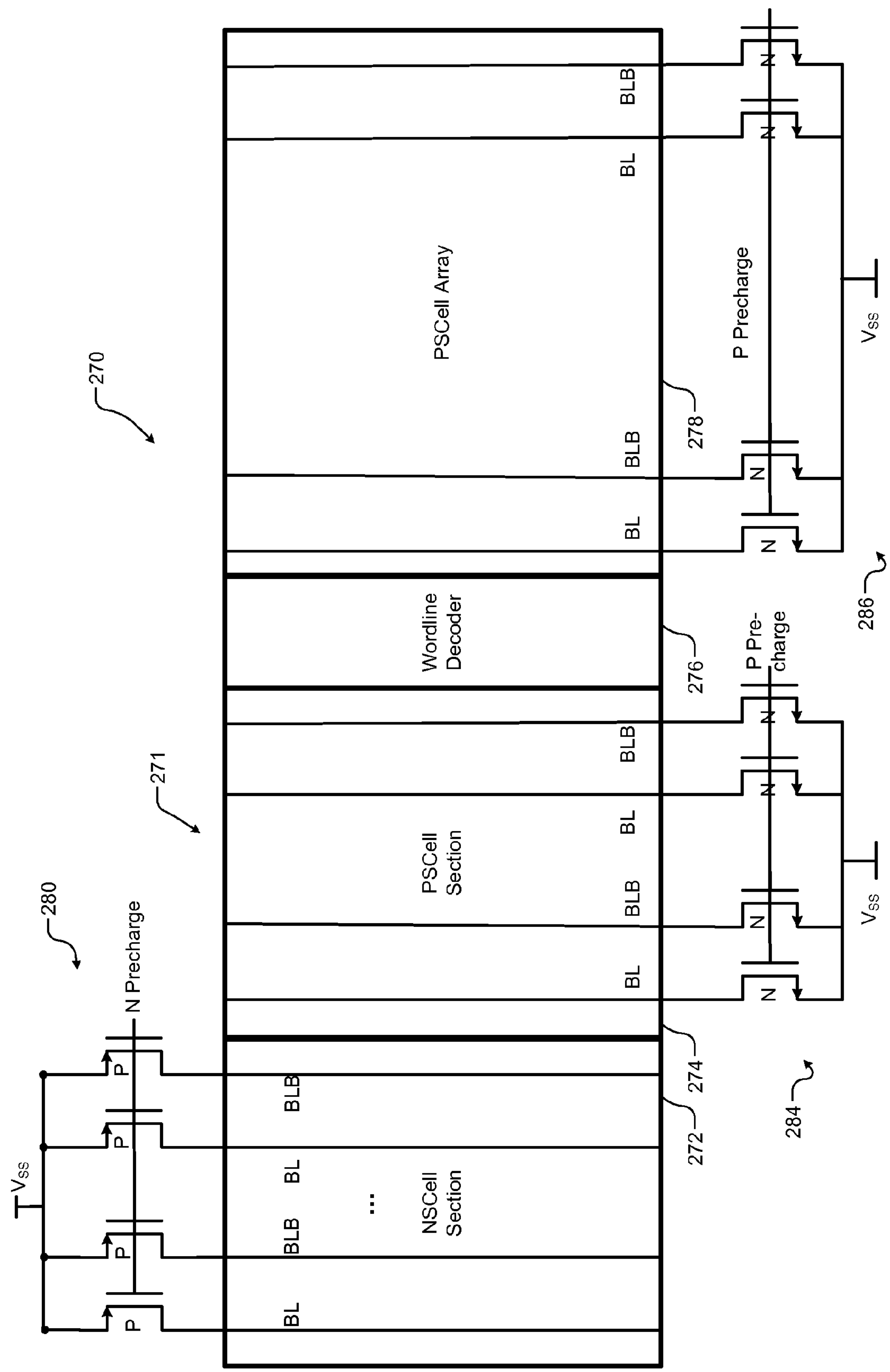
Figure 9B:
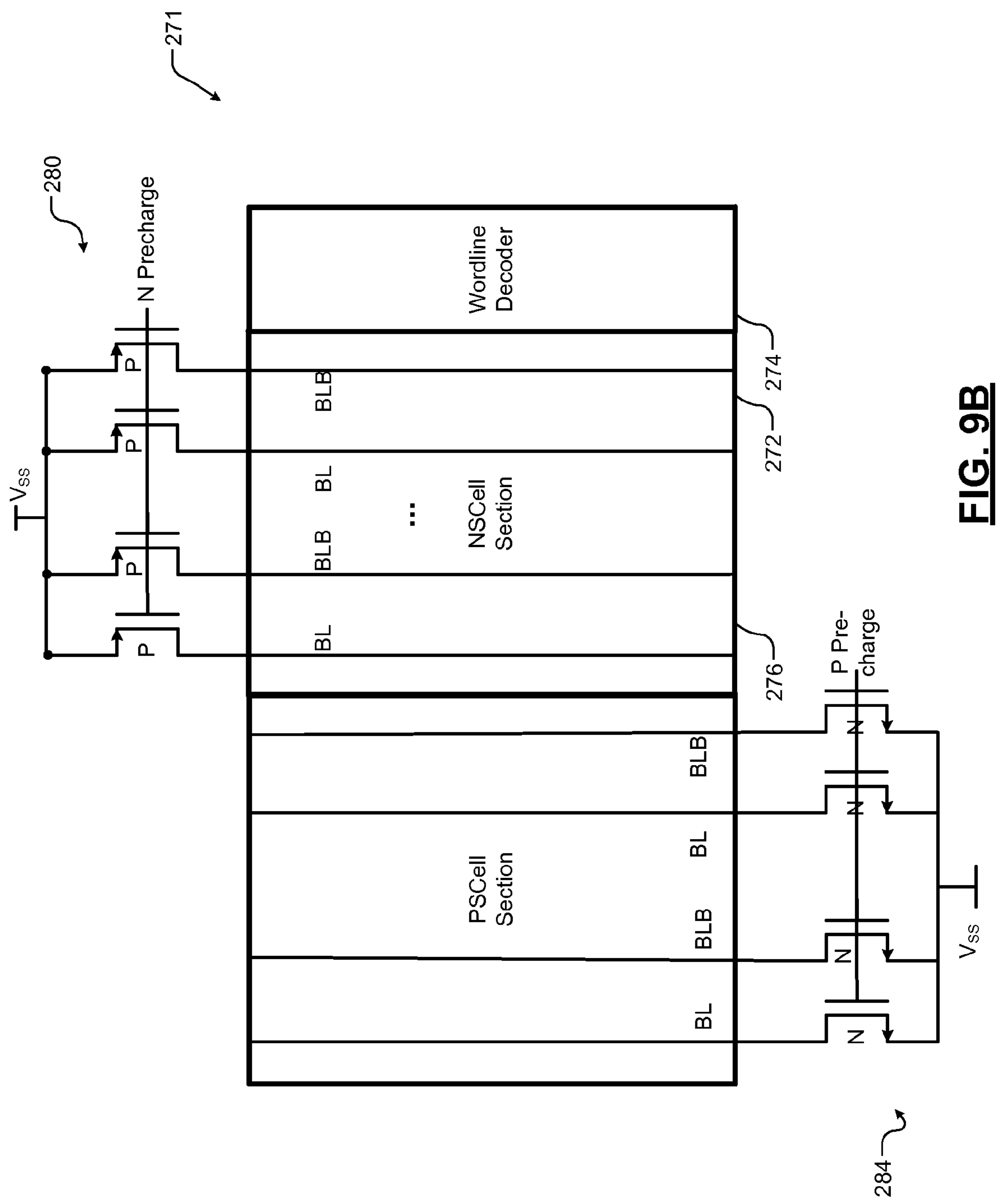

FIG. 9 shows another example of a memory system 270 including an array 271 with an NScell section 272 and a PScell section 274. The memory system 270 further includes a wordline decoder/driver 276 and a PS cell array 278. The NScell section 272, the PScell section 274, and the PS cell array 278 are associated with pre-charge circuits 280, 284 and 286, respectively. The wordline decoder/driver 276 is connected between the PScell section 274 and the PScell array 278. The PScell section 274 is connected between the NScell section 272 and the wordline decoder/driver 276.

Figure 10A:
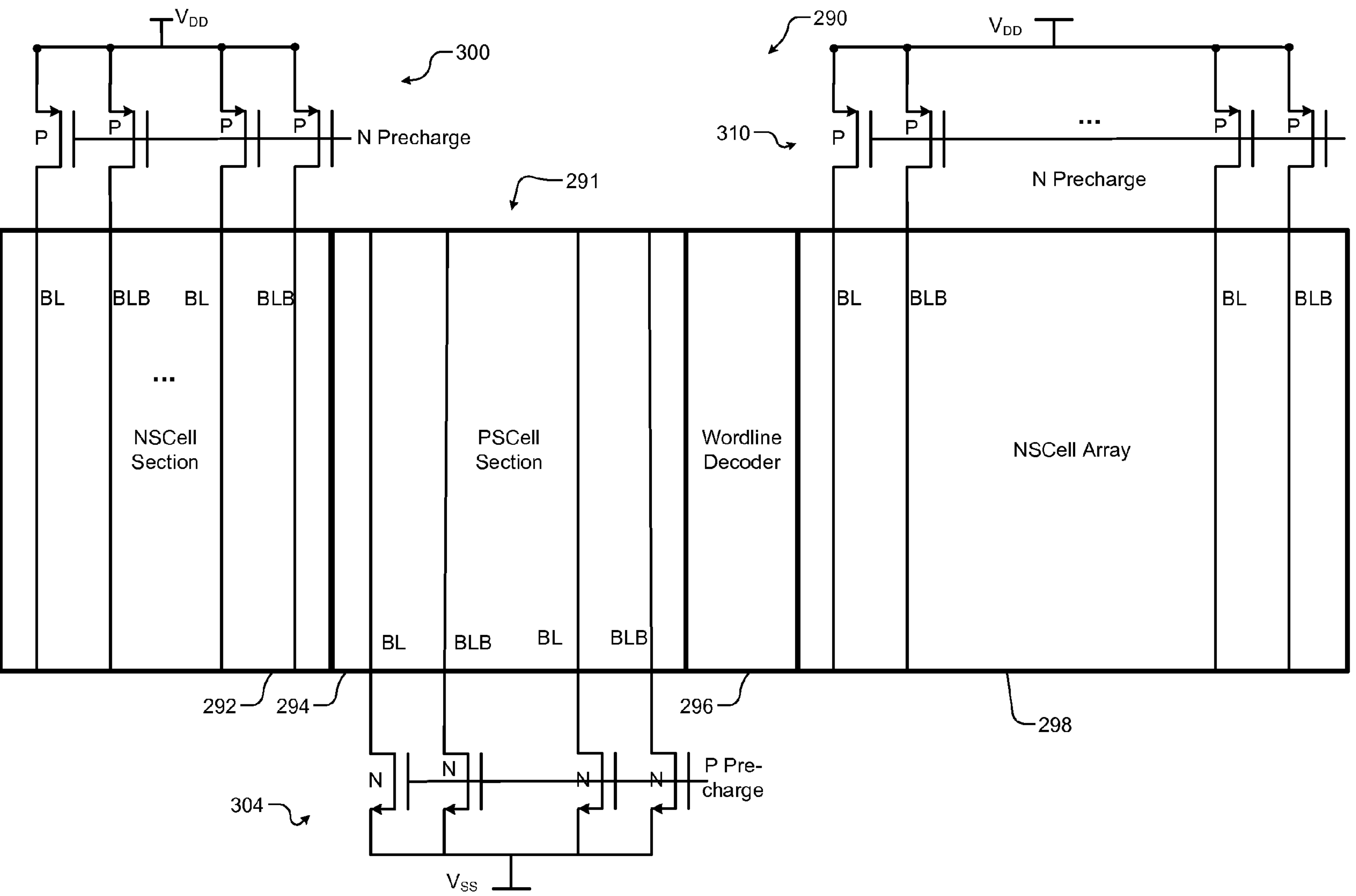
Figure 10B:
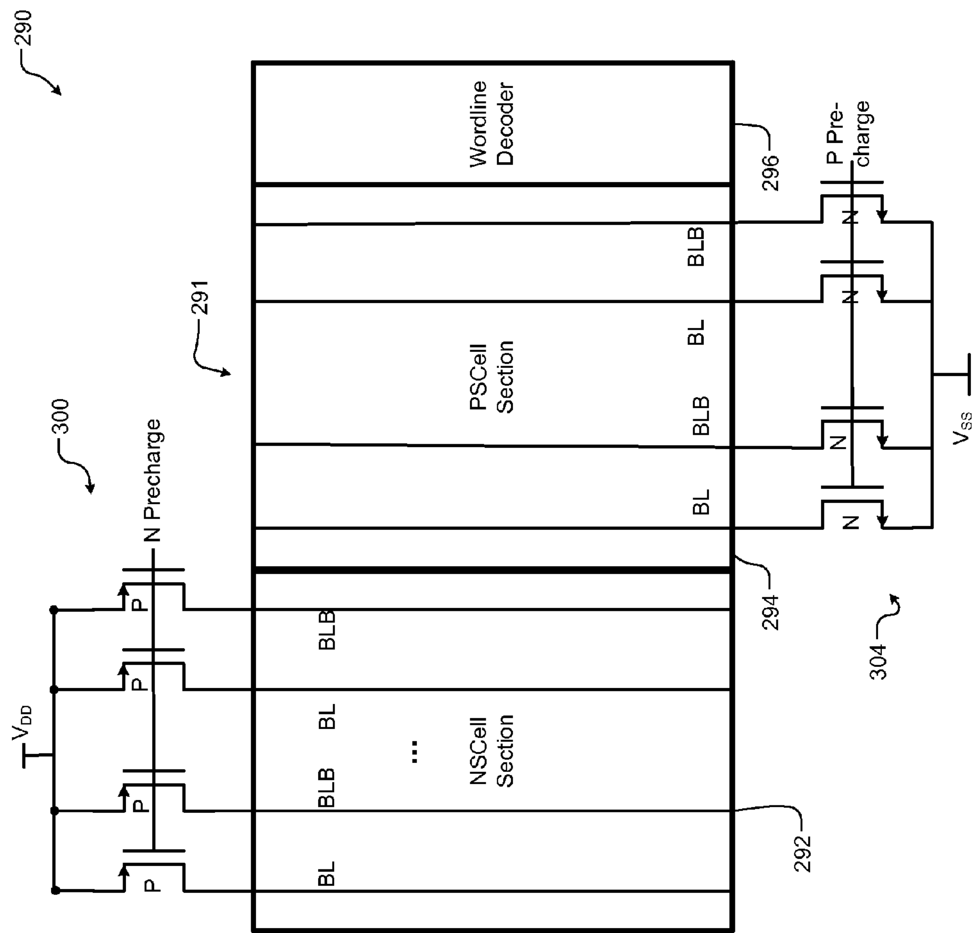

FIG. 10 shows another example of a memory system 290 including an array 291 with an NScell section 292 and a PScell section 294. The memory system 290 further includes a wordline decoder/driver 296 and a NScell array 298. The NScell section 292, the PScell section 294, and the NScell array 298 are associated with pre-charge circuits 300, 304 and 310, respectively. The wordline decoder/driver 296 is connected between the PScell section 294 and the NScell array 298. The PScell section 294 is connected between the NScell section 292 and the wordline decoder/driver 296.

The bitlines of an array of PScells are pre-charged or referenced low before reading or writing of the cell. The transistors of the PScell are sized such that the contents of the cell can be changed during write operation and contents do not change during a read operation.

Figure 11A:
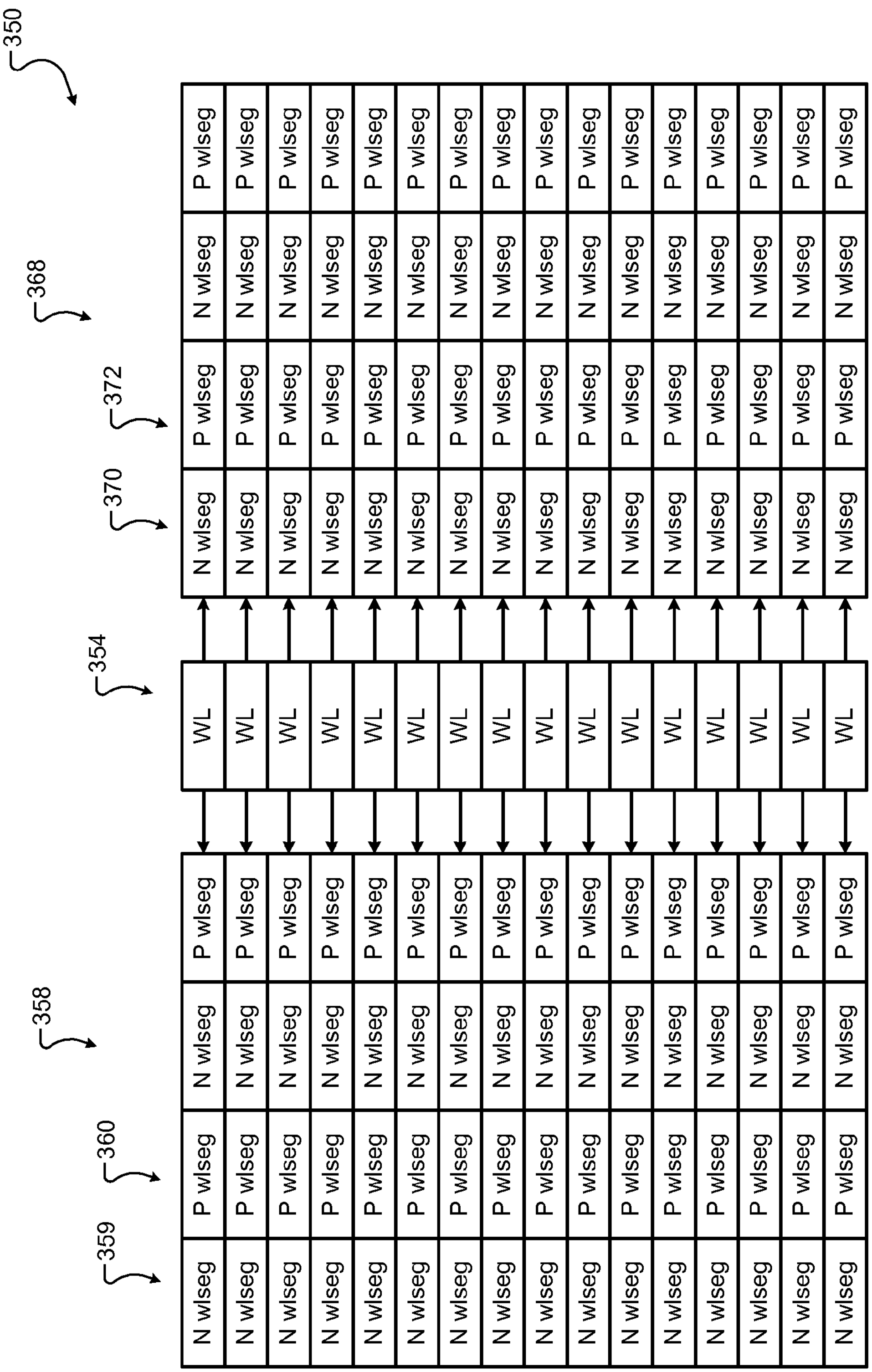

FIG. 11A shows an example of a memory system 350 including a wordline decoder/driver 354 and an array 358 including alternating N wordline segments 359 and P wordline segments 360 connected to the wordline decoder/driver 354. Another array 368 includes alternating N wordline segments 370 and P wordline segments 372 and is connected to the wordline decoder/driver 354.

Figure 11B:
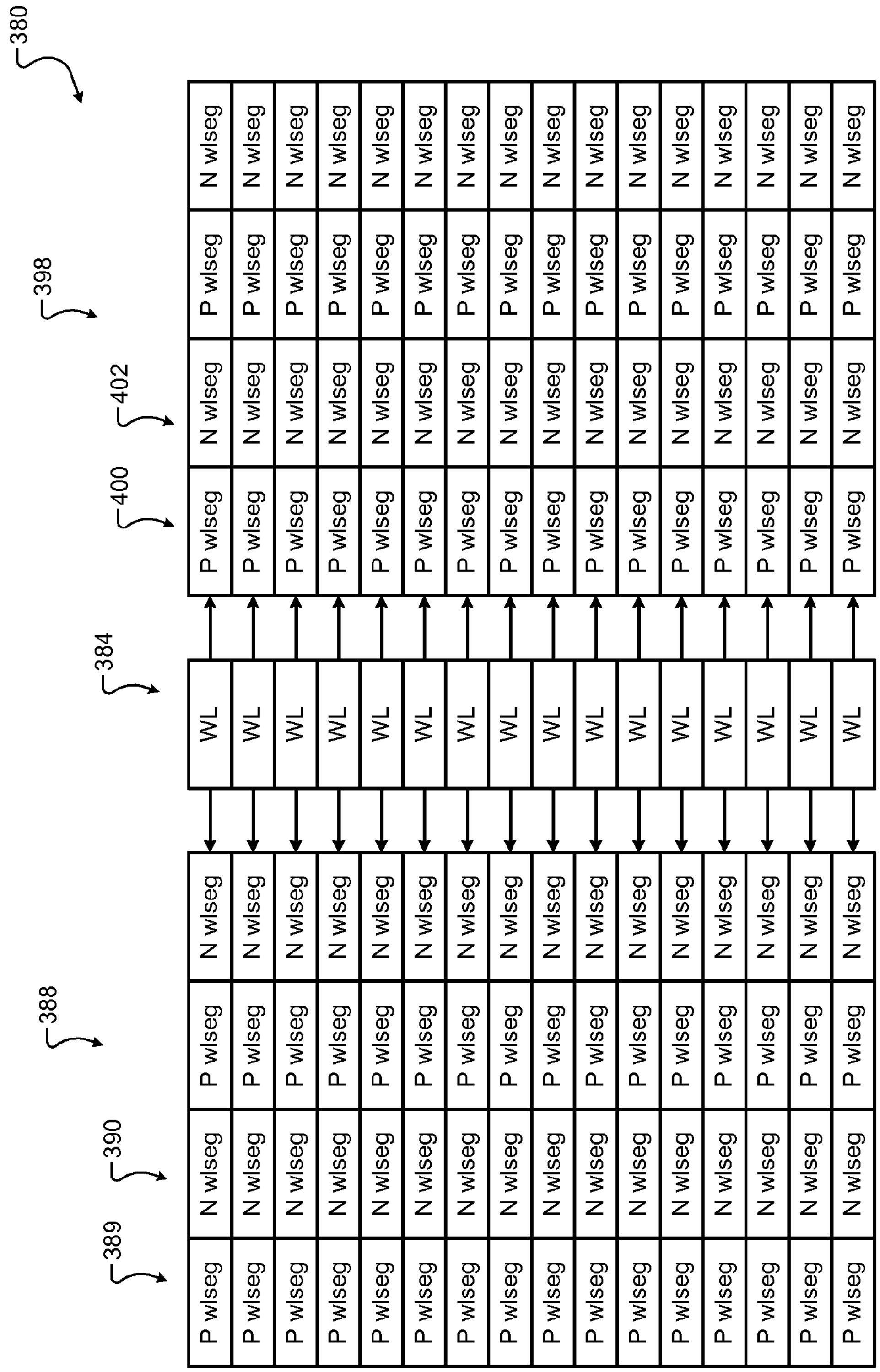

FIG. 11B shows an example of a memory system 380 including a wordline decoder/driver 384 and an array 388 including alternating N wordline segments 389 and P wordline segments 390 connected to the wordline decoder/driver 384. Another array 398 includes alternating N wordline segments 400 and P wordline segments 402 and is connected to the wordline decoder/driver 384.

While various examples are shown and described above, additional variations include a memory system incorporating PScells, or PScells and NScells. Another example of a memory includes PScells in PScell only arrays and NScells in NScell only arrays. Another example of a memory includes PScells in PScell-only arrays and NScells in NScell only arrays and arrays which include both PScells and NScells. Another example of a memory includes PScells in PScell-only arrays and arrays that include both PScells and NScells. Another example of a memory includes NScells in NScell-only arrays and arrays which contain both PScells and NScells. Another example of a memory includes only arrays which contain both PScells and NScells. Another example of a memory includes a subset of the total number of array bitlines that are pre-charged or referenced high and the remainder are pre-charged or referenced low before a read or write operation.

In other examples, a memory includes a memory array wordlines including PScells. Another example of a memory includes array wordlines including segments connected to PScells and segments connected to NScells.

In other examples, while FIGS. 5-7 show examples of wordline segments with a single inverter arranged at an input of the wordline segment, the inverter can be arranged at the output of the wordline segment. In other words, the end of a segment of memory cells of type couples to the input of an inverter. An output of the inverter drives a segment of memory cells of the opposite type.

Figure 12:
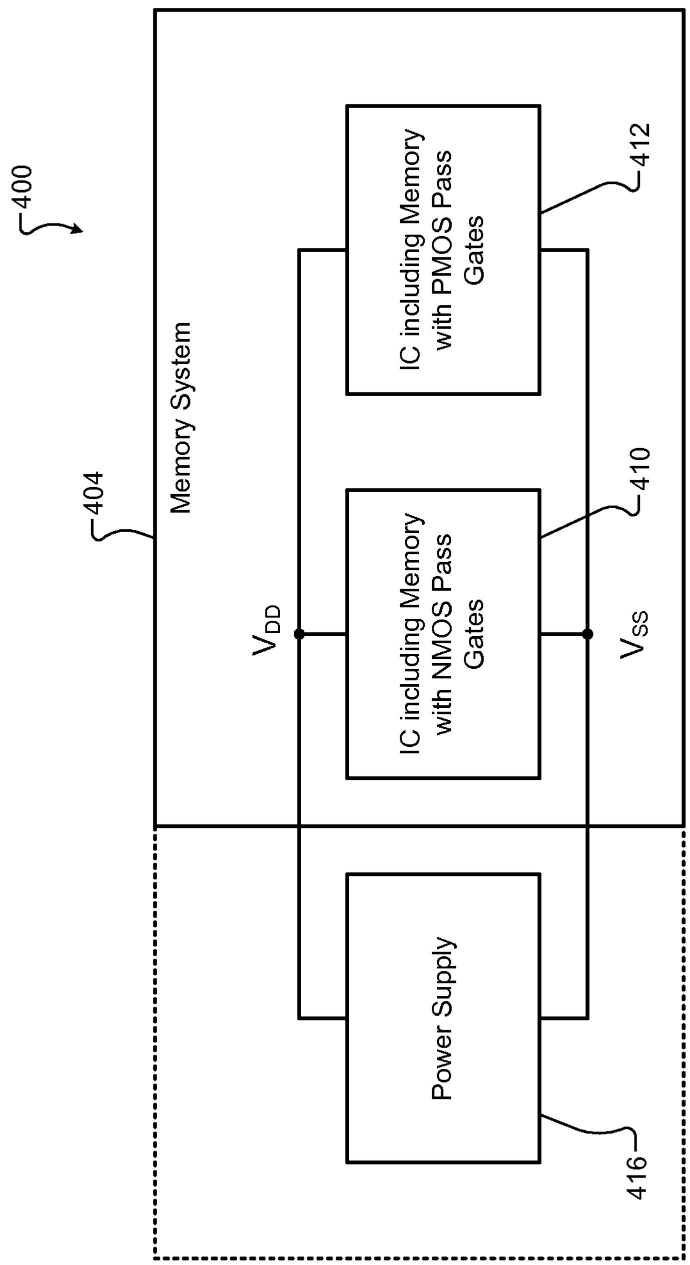
FIG. 12 is a functional block diagram of a system including a first IC including first memory cells with NMOS pass gates, a second IC including second memory cells with PMOS pass gates and a power supply connected to the first and second ICs.

FIG. 12 illustrates a system 400 comprising a memory system 404 including a first integrated circuit (IC) 410 with first memory cells having NMOS pass gates, a second IC 412 with second memory cells with PMOS pass gates, and a power supply 416. The power supply 416 may be integrated with one of the ICs of the memory system 400 or separate. Both the first IC 410 and the second IC 412 can be connected to and powered by the same power supply. As can be appreciated, the arrangement shown in FIG. 12 reduces a demand on the power supply as described above.

Figure 13:
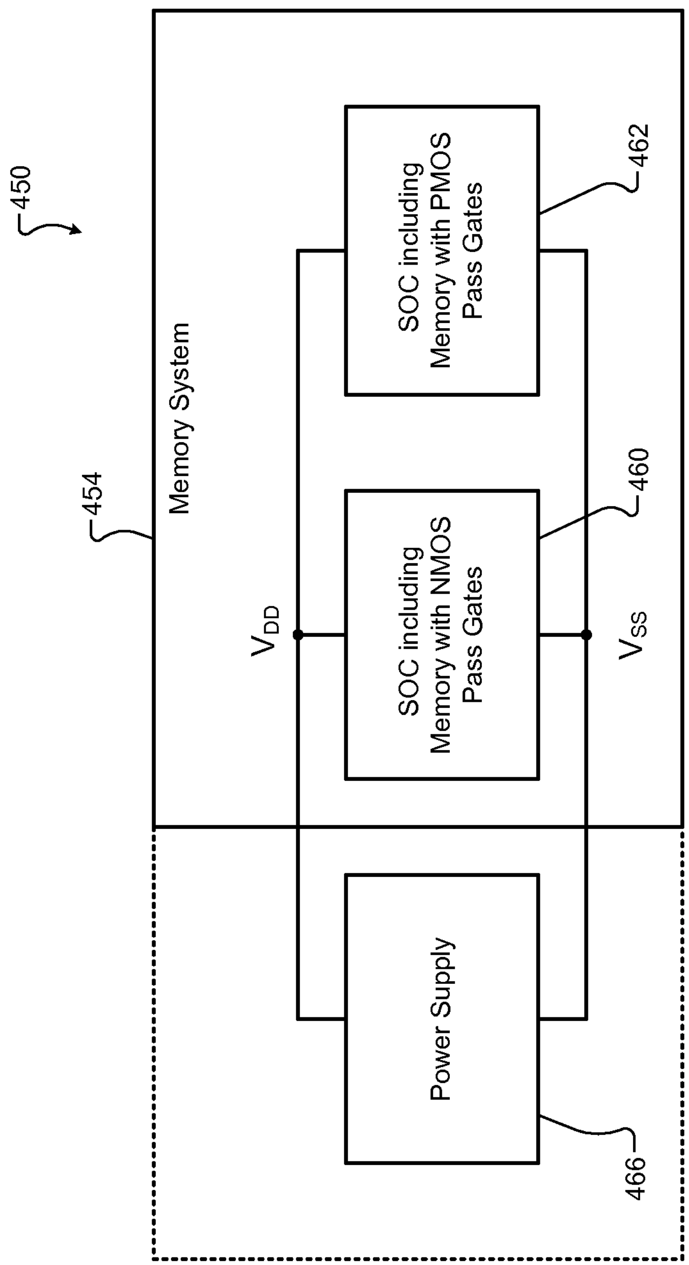
FIG. 13 is a functional block diagram of a system including a first SOC including first memory cells with NMOS pass gates, a second SOC including second memory cells with PMOS pass gates and a power supply connected to the first and second memory SOCs.

FIG. 13 illustrates a system 450 comprising a memory system 454 including a first system on chip (SOC) 460 with first memory cells having NMOS pass gates, a second SOC 462 with second memory cells with PMOS pass gates, and a power supply 466. The power supply 466 may be integrated with one of the SOCs of the memory system 450 or separate. For example only, both the first SOC 460 and the second SOC 462 can be connected to and powered by the same power supply. As can be appreciated, the arrangement shown in FIG. 13 reduces a demand on the power supply as described above.

Figure 14:
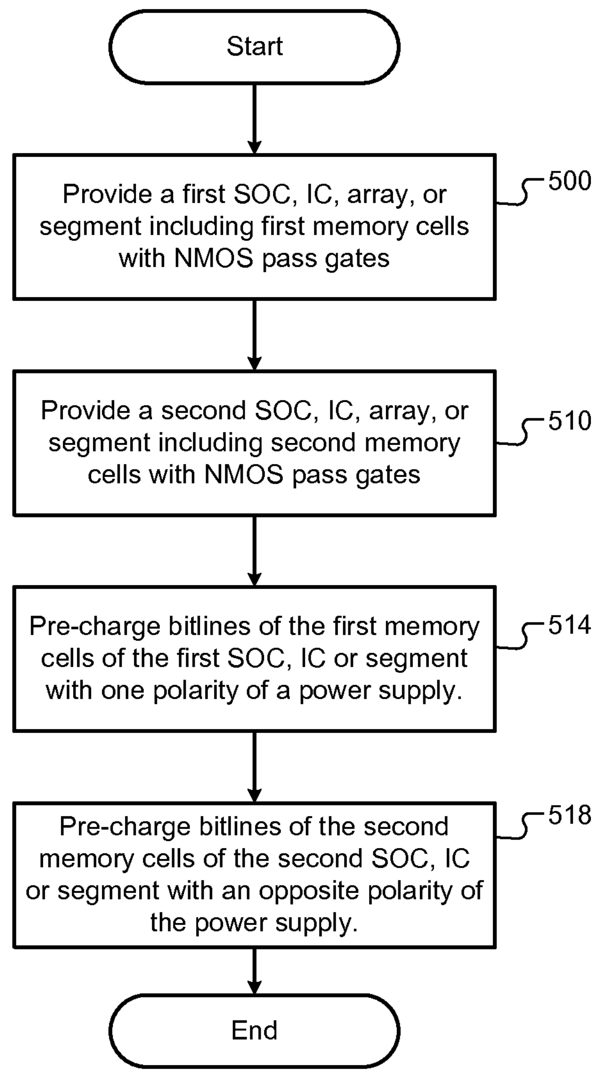
FIG. 14 is a flowchart illustrating an example of a method for operating a system including memory according to the present disclosure.

Referring now to FIG. 14, a method for providing a memory system is shown. At 550, a first SOC, IC, array, or segment is provided and includes first memory cells with NMOS pass gates. At 514, a second SOC, IC, array, or segment is provided and includes second memory cells with NMOS pass gates. At 514, the first SOC, IC, array, or segment is pre-charged by one polarity of a power supply. At 518, the second SOC, IC, array, or segment is pre-charged by an opposite polarity of the power supply. In some examples, the first SOC, IC, array or segment is pre-charged by a pre-charge circuit connected to one polarity of the power supply and the second SOC, IC, array or segment is pre-charged by a pre-charge circuit connected to the opposite polarity of the power supply.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A memory, comprising:

first memory cells, each of the first memory cells comprising first and second pass gates including NMOS transistors;

second memory cells, each of the second memory cells comprising first and second pass gates including PMOS transistors, wherein the first memory cells are pre-charged by one polarity of a voltage supply, and wherein the second memory cells are pre-charged by an opposite polarity of the voltage supply, first wordline segments, each of the first wordline segments including a plurality of the first memory cells; and second wordline segments, each of the second wordline segments including a plurality of the second memory cells, wherein individual ones of the first wordline segments are arranged between individual ones of the second wordline segments such that the individual ones of the first wordline segments alternate with the individual ones of the second wordline segments in a row of the memory.

2. A memory, comprising:

first memory cells, each of the first memory cells comprising first and second pass gates including NMOS transistors;

second memory cells, each of the second memory cells comprising first and second pass gates including PMOS transistors, wherein the first memory cells are pre-charged by one polarity of a voltage supply, and wherein the second memory cells are pre-charged by an opposite polarity of the voltage supply, first wordline segments, each of the first wordline segments including a plurality of the first memory cells;

second wordline segments, each of the second wordline segments including a plurality of the second memory cells, wherein ones of the first wordline segments are arranged between ones of the second wordline segments;

a first pre-charge circuit connected to the one polarity of the voltage supply and to the first memory cells; and a second pre-charge circuit connected to the opposite polarity of the voltage supply and to the second memory cells.

3. The memory of claim 1, further comprising:

a first integrated circuit comprising the first memory cells; and a second integrated circuit comprising the second memory cells.

4. A memory, comprising:

first memory cells, each of the first memory cells comprising first and second pass gates including NMOS transistors;

second memory cells, each of the second memory cells comprising first and second pass gates including PMOS transistors, wherein the first memory cells are pre-charged by one polarity of a voltage supply, and wherein the second memory cells are pre-charged by an opposite polarity of the voltage supply, first wordline segments, each of the first wordline segments including a plurality of the first memory cells;

second wordline segments, each of the second wordline segments including a plurality of the second memory cells, wherein ones of the first wordline segments are arranged between ones of the second wordline segments;

a first system on chip (SOC) comprising the first memory cells; and a second SOC comprising the second memory cells.

5. The memory of claim 1, further comprising:

a first array comprising the first memory cells;

a second array comprising the second memory cells; and a decoder circuit connected to at least one of the first array and the second array.

6. The memory of claim 1, wherein the first memory cells and the second memory cells comprise static random access memory (SRAM) cells.

7. A memory, comprising:

first memory cells, each of the first memory cells comprising first and second pass gates including NMOS transistors;

second memory cells, each of the second memory cells comprising first and second pass gates including PMOS transistors, wherein the first memory cells are pre-charged by one polarity of a voltage supply, and wherein the second memory cells are pre-charged by an opposite polarity of the voltage supply, first wordline segments, each of the first wordline segments including a plurality of the first memory cells; and second wordline segments, each of the second wordline segments including a plurality of the second memory cells, wherein ones of the first wordline segments are arranged between ones of the second wordline segments, wherein:

each of the first wordline segments comprises a buffer including a single inverter; and each of the second wordline segments comprises a buffer including a single inverter.

8. A memory, comprising:

first memory cells, each of the first memory cells comprising first and second pass gates including NMOS transistors;

second memory cells, each of the second memory cells comprising first and second pass gates including PMOS transistors, wherein the first memory cells are pre-charged by one polarity of a voltage supply, and wherein the second memory cells are pre-charged by an opposite polarity of the voltage supply, first wordline segments, each of the first wordline segments including a plurality of the first memory cells; and second wordline segments, each of the second wordline segments including a plurality of the second memory cells, wherein ones of the first wordline segments are arranged between ones of the second wordline segments, wherein:

first bitlines of the first memory cells in the first wordline segments are selectively pre-charged by the one polarity of the voltage supply; and second bitlines of the second memory cells in the second wordline segments are selectively pre-charged by the opposite polarity of the voltage supply.

9. A system comprising:

a first memory and a second memory in accordance with the memory of claim 1; and a wordline decoder/driver connected to wordlines of the first memory and the second memory.

10. A system comprising:

the memory of claim 1; and a wordline decoder/driver connected to wordlines of the memory.

11. A memory system comprising:

a first array including a plurality of first wordline segments, wherein each of the plurality of first wordline segments includes a plurality of first memory cells, and each of the plurality of first memory cells comprise first and second pass gates including NMOS transistors;

a second array including a plurality of second wordline segments, wherein each of the plurality of second wordline segments includes a plurality of second memory cells, and each of the plurality of second memory cells comprise first and second pass gates including PMOS transistors; and a wordline decoder/driver connected to first wordlines of the plurality of first wordline segments and second wordlines of the plurality of first wordline segments, wherein individual ones of the first wordline segments are arranged between individual ones of the second wordline segments such that the individual ones of the first wordline segments alternate with the individual ones of the second wordline segments in a row of the memory.

12. The memory system of claim 11, wherein each of the plurality of first wordline segments comprises a buffer including only a single inverter, and each of the plurality of second wordline segments comprises a buffer including only a single inverter.

13. The memory system of claim 11, wherein the plurality of first memory cells in the first wordline segments are selectively pre-charged by one polarity of a voltage supply; and the plurality of second memory cells in the second wordline segments are selectively pre-charged by an opposite polarity of the voltage supply.

14. A memory system comprising:

a first array including:

a plurality of first wordline segments, each of the plurality of first wordline segments including a plurality of first memory cells, each of the plurality of first memory cells comprising first and second pass gates including NMOS transistors; and a plurality of second wordline segments, each of the plurality of second wordline segments including a plurality of second memory cells, each of the plurality of second memory cells comprising first and second pass gates including PMOS transistors, wherein ones of the plurality of first wordline segments are arranged between ones of the plurality of second wordline segments;

a second array including:

a plurality of third wordline segments, each of the plurality of third wordline segments including a plurality of third memory cells, each of the plurality of third memory cells comprising first and second pass gates including NMOS transistors; and a plurality of fourth wordline segments, each of the plurality of fourth wordline segments including a plurality of fourth memory cells, each of the plurality of fourth memory cells comprising first and second pass gates including PMOS transistors, wherein ones of the plurality of third wordline segments are arranged between ones of the plurality of fourth wordline segments; and a wordline decoder/driver connected to first wordlines of the first array and second wordlines of the second array.

15. The memory system of claim 14, wherein each of the plurality of first wordline segments comprises a buffer including only a single inverter, and each of the plurality of second wordline segments comprises a buffer including only a single inverter.

16. The memory system of claim 15, wherein the plurality of first memory cells in the first wordline segments are selectively pre-charged by a first voltage supply to a first voltage reference, the plurality of second memory cells in the second wordline segments are selectively pre-charged by a second voltage supply to a second voltage reference.

17. A method for providing memory in a system, comprising:

providing a first array or segment, wherein the first array or segment includes first memory cells with NMOS pass gates;

providing a second array or segment, wherein the second array or segment includes second memory cells with PMOS pass gates;

connecting the first array or segment to one polarity of a power supply and the second array or segment to an opposite polarity of the power supply;

pre-charging the first memory cells with the one polarity of the power supply; and pre-charging the second memory cells with the opposite polarity of the power supply, wherein the first array or segment includes a plurality of first wordline segments, each of the plurality of first wordline segments including the first memory cells, the second array or segment includes a plurality of second wordline segments, each of the plurality of second wordline segments including the second memory cells, and ones of the first wordline segments are arranged between ones of the second wordline segments.

18. The method of claim 17, wherein the first memory cells and the second memory cells comprise static random access memory (SRAM) cells.

19. The method of claim 17, wherein each of the plurality of first wordline segments comprises a buffer including a single inverter and each of the plurality of second wordline segments comprises a buffer including a single inverter.

20. The method of claim 17, wherein the connecting includes:

pre-charging bitlines of the first memory cells of the first array or segment using one polarity of the power supply; and pre-charging bitlines of the second memory cells of the second array or segment using an opposite polarity of the power supply.

* * * * *